(12) United States Patent
Lee et al.

(10) Patent No.: US 9,741,770 B2
(45) Date of Patent: Aug. 22, 2017

(54) ORGANIC LIGHT EMITTING DIODE DISPLAY

(71) Applicant: SAMSUNG DISPLAY CO., LTD., Yongin-si, Gyeonggi-do (KR)

(72) Inventors: Gi Chang Lee, Asan-si (KR); In Soo Wang, Asan-si (KR); Yong Soo Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/009,729

(22) Filed: Jan. 28, 2016

(65) Prior Publication Data
US 2016/0225828 A1 Aug. 4, 2016

(30) Foreign Application Priority Data
Feb. 3, 2015 (KR) .................... 10-2015-0016954

(51) Int. Cl.
| | | |
|---|---|---|
| *H01L 21/00* | (2006.01) | |
| *H01L 27/32* | (2006.01) | |
| *H01L 51/52* | (2006.01) | |

(52) U.S. Cl.
CPC ........ *H01L 27/322* (2013.01); *H01L 51/5218* (2013.01); *H01L 51/5231* (2013.01)

(58) Field of Classification Search
CPC H01L 27/322; H01L 51/5231; H01L 51/5218
See application file for complete search history.

(56) References Cited

U.S. PATENT DOCUMENTS

| | | | | |
|---|---|---|---|---|
| 7,348,207 B2* | 3/2008 | Kobayashi | ........... | H01L 27/322 257/103 |
| 7,375,464 B2* | 5/2008 | Chin | ............... | H01L 27/322 313/112 |
| 7,906,898 B2* | 3/2011 | Lee | ................ | H01L 27/3244 313/504 |
| 8,648,526 B2* | 2/2014 | Lee | ................ | H01L 27/322 313/504 |
| 8,921,840 B2* | 12/2014 | Kim | ................ | H01L 51/5284 257/40 |
| 9,246,136 B2* | 1/2016 | Song | ............... | H01L 27/3244 |
| 9,287,528 B2* | 3/2016 | Kim | ................ | H01L 27/1255 |
| 9,329,441 B2* | 5/2016 | Song | ............... | G02F 1/134309 |
| 9,425,245 B2* | 8/2016 | Song | ............... | H01L 27/3276 |
| 2005/0225238 A1* | 10/2005 | Yamazaki | ........... | H01L 27/322 313/506 |

(Continued)

FOREIGN PATENT DOCUMENTS

| | | |
|---|---|---|
| JP | 2008-026382 A | 2/2008 |
| JP | 2008-270061 A | 11/2008 |

(Continued)

*Primary Examiner* — Laura Menz
(74) *Attorney, Agent, or Firm* — Lewis Roca Rothgerber Christie LLP

(57) ABSTRACT

An organic light emitting diode display includes a substrate, a transistor on the substrate, a reflecting electrode connected to the transistor, a color filter on the reflecting electrode, a first electrode on the color filter and electrically connected to the reflecting electrode, a pixel definition layer on the color filter and having an opening exposing the first electrode, a white emission layer in the opening and a second electrode on the white emission layer.

6 Claims, 5 Drawing Sheets

(56) References Cited

U.S. PATENT DOCUMENTS

| | | | | |
|---|---|---|---|---|
| 2006/0152151 | A1* | 7/2006 | Seo | H01L 27/322 313/506 |
| 2007/0108899 | A1* | 5/2007 | Jung | H01L 27/3276 313/506 |
| 2007/0126969 | A1* | 6/2007 | Kimura | G02F 1/134363 349/141 |
| 2008/0007492 | A1* | 1/2008 | Koh | H01L 27/3213 345/76 |
| 2008/0024402 | A1* | 1/2008 | Nishikawa | H01L 51/5209 345/82 |
| 2009/0251048 | A1* | 10/2009 | Choi | H01L 27/322 313/504 |
| 2010/0171107 | A1* | 7/2010 | Jung | H01L 27/322 257/40 |
| 2014/0145979 | A1* | 5/2014 | Lee | G06F 3/0412 345/173 |
| 2014/0159009 | A1* | 6/2014 | Song | H01L 51/5271 257/40 |
| 2014/0312319 | A1* | 10/2014 | Kim | H01L 27/3258 257/40 |
| 2014/0312339 | A1* | 10/2014 | Fujita | H01L 27/322 257/40 |
| 2014/0346449 | A1* | 11/2014 | Choi | H01L 27/3211 257/40 |
| 2014/0346468 | A1* | 11/2014 | Kim | H01L 27/3246 257/40 |
| 2015/0014636 | A1* | 1/2015 | Kang | H01L 51/5253 257/40 |
| 2015/0060784 | A1* | 3/2015 | Lee | H01L 27/3244 257/40 |
| 2015/0060792 | A1* | 3/2015 | Lee | H01L 51/5275 257/40 |
| 2015/0207094 | A1* | 7/2015 | Hwang | H01L 51/5203 257/88 |
| 2016/0043336 | A1* | 2/2016 | Kim | H01L 27/323 257/40 |
| 2016/0126496 | A1* | 5/2016 | Wang | H01L 51/5256 257/40 |
| 2016/0211307 | A1* | 7/2016 | Kim | H01L 51/5225 |
| 2016/0218157 | A1* | 7/2016 | Ahn | H01L 51/5284 |
| 2016/0225828 | A1* | 8/2016 | Lee | H01L 51/5231 |
| 2016/0307931 | A1* | 10/2016 | Hong | H01L 27/1222 |
| 2016/0307976 | A1* | 10/2016 | You | H01L 27/3246 |
| 2016/0322000 | A1* | 11/2016 | Kim | G09G 3/2003 |
| 2016/0343783 | A1* | 11/2016 | Kim | H01L 27/3218 |
| 2017/0069852 | A1* | 3/2017 | Kanamoto | C07D 491/048 |
| 2017/0084862 | A1* | 3/2017 | Lee | H01L 51/5212 |

FOREIGN PATENT DOCUMENTS

| | | |
|---|---|---|
| KR | 10-2008-0066680 A | 7/2008 |
| KR | 10-2014-0037717 A | 3/2014 |

\* cited by examiner

ORGANIC LIGHT EMITTING DIODE DISPLAY

CROSS-REFERENCE TO RELATED APPLICATION

This application claims priority to and the benefit of Korean Patent Application No. 10-2015-0016954 filed in the Korean Intellectual Property Office on Feb. 3, 2015, the entire contents of which are incorporated herein by reference.

BACKGROUND

1. Field

The present disclosure relates to a display device. More particularly, the present disclosure relates to an organic light emitting diode display.

2. Description of the Related Art

An organic light emitting diode display includes organic light emitting diodes each including of a hole injection electrode, an organic emission layer, and an electronic injection electrode. Each of the organic light emitting diodes emits light by energy generated when excitons generated by combining electrons and holes with each other in the organic emission layer drop from an excited state to a base state, and the organic light emitting diode display displays an image using this light emission.

The organic light emitting diode display has self-luminance characteristics, and does not require a separate light source unlike a liquid crystal display, such that a thickness and a weight of the organic light emitting diode display may be reduced. In addition, since the organic light emitting diode display shows high grade characteristics such as low power consumption, high luminance, rapid response, and/or the like, the organic light emitting diode display has been in the spotlight as the next generation display.

When the display having the self-luminance characteristics is used as a display for a vehicle, a transmission image should be viewed through glasses or a vehicle glass. In addition, since the display is mainly used outdoors in the daytime, the display should be brighter than sunlight, which is external light, in order to be viewed. Therefore, a display having a high luminance is required.

However, there is a lifespan issue of the organic light emitting diode, such that a current value flowing in the organic light emitting diode may not be infinitely increased, and a heat generation problem may occur when a current flowing in the organic light emitting diode is increased. Therefore, a method for accomplishing a high luminance utilizing an existing organic light emitting diode is desired.

To this end, a pentile structure has been formed by adding a white emission layer. However, an entire luminance is increased, while a driving scheme is complicated and a resolution is decreased. In addition, since one white pixel is present per red pixel, blue pixel, and green pixel, there is a limitation in accomplishing the high luminance.

The above information disclosed in this Background section is only for enhancement of understanding of the background of the disclosure and therefore it may contain information that does not form prior art.

SUMMARY

The present disclosure has been made in an effort to provide an organic light emitting diode display having a high luminance without complicated driving of a pentile structure.

An exemplary embodiment of the present disclosure provides an organic light emitting diode display including: a substrate; a transistor on the substrate; a reflecting electrode connected to the transistor; a color filter on the reflecting electrode; a first electrode on the color filter and electrically connected to the reflecting electrode; a pixel definition layer on the color filter and having an opening exposing the first electrode; a white emission layer in the opening; and a second electrode on the white emission layer.

The first electrode and the second electrode may be made of a transparent conductive material.

The transparent conductive material may be indium tin oxide (ITO) or indium zinc oxide (IZO).

The reflecting electrode may be made of a reflecting material.

The reflecting material may be silver.

The color filter may be a red color filter, a green color filter, or a blue color filter.

Another exemplary embodiment of the present disclosure provides an organic light emitting diode display including: a substrate; a transistor on the substrate; a first electrode connected to the transistor; a pixel definition layer on the first electrode and having an opening exposing the first electrode; a white emission layer in the opening; a second electrode on the white emission layer; a color filter on the second electrode; and a reflecting electrode on the color filter and connected to the second electrode through a contact hole.

The first electrode and the second electrode may be made of a transparent conductive material.

The transparent conductive material may be indium tin oxide (ITO) or indium zinc oxide (IZO).

The reflecting electrode may be made of a reflecting material, and the reflecting material may be silver.

The color filter may be a red color filter, a green color filter, or a blue color filter.

When the organic light emitting diode display is formed as in the present disclosure, it is possible to provide an organic light emitting diode display having a high luminance without performing complicated driving using a pentile structure.

DETAILED DESCRIPTION OF THE EMBODIMENTS

Figure 1:
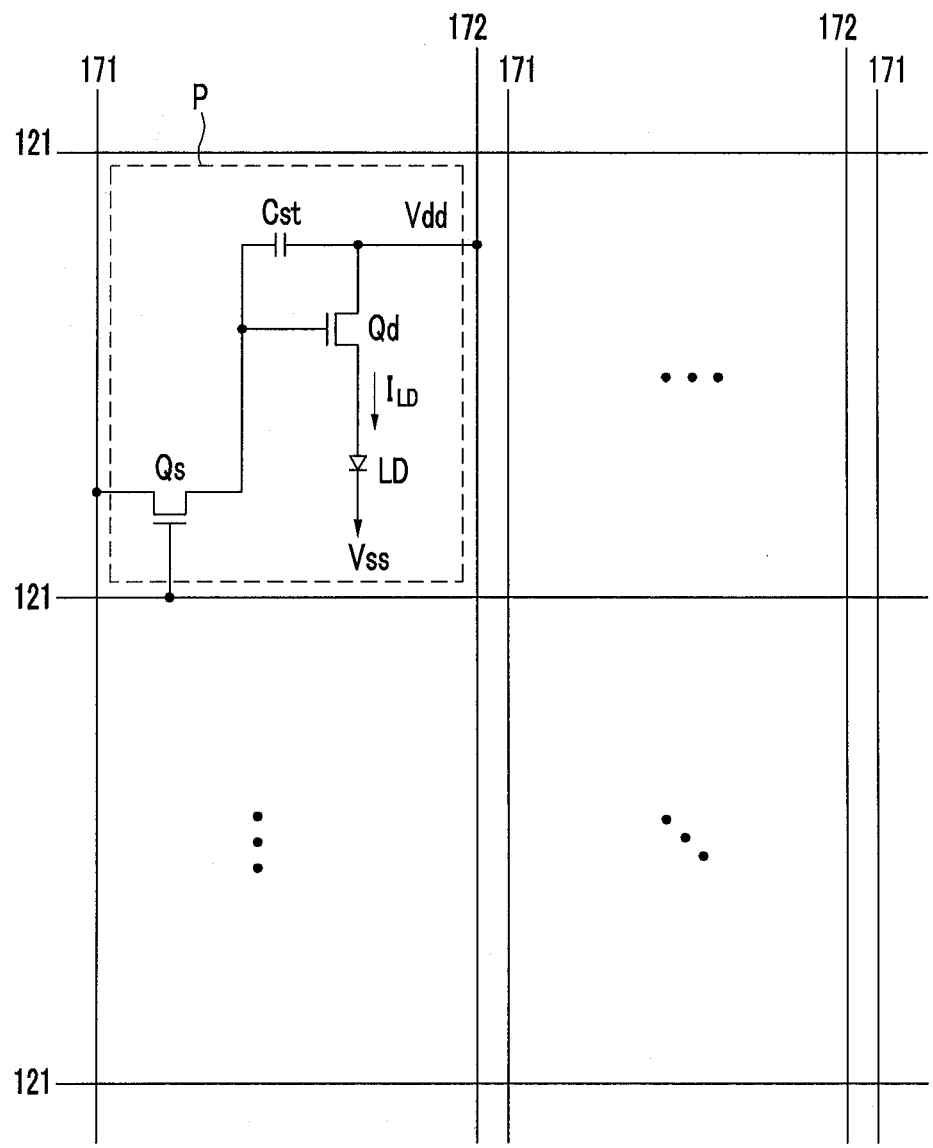
FIG. 1 is an equivalent circuit diagram of one pixel of an organic light emitting diode display according to an exemplary embodiment of the present disclosure.

Hereinafter, exemplary embodiments of the present disclosure will be described more fully with reference to the accompanying drawings so as to be easily practiced by those skilled in the art to which the present disclosure pertains. As those skilled in the art would realize, the described embodiments may be modified in various different ways, all without departing from the spirit or scope of the present disclosure.

Portions unrelated to the description may be omitted in order to more clearly describe the present disclosure, and similar components will be denoted by the same reference numerals throughout the present specification.

In addition, sizes and thicknesses of the respective components shown in the accompanying drawings are arbitrarily shown for convenience of explanation. The present disclosure is not necessarily limited to contents shown in the accompanying drawings.

In the drawings, the thickness of layers, films, panels, regions, etc., are exaggerated for clarity. In addition, in the accompanying drawings, thicknesses of some of layers and regions have been exaggerated for convenience of explanation. It will be understood that when an element such as a layer, film, region, or substrate is referred to as being "on" another element, it can be directly on the other element or intervening elements (or components) may also be present.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

In addition, throughout the present specification, unless explicitly described to the contrary, the words "comprise" and "include as well as variations such as "comprises," "comprising," "including," and includes," will be understood to imply the inclusion of stated elements (or components) but not the exclusion of any other elements. In addition, throughout the specification, the word "on" does not necessarily mean that any element is positioned at an upper side based on a gravity direction, but means that any element is positioned above or below a target portion. When an element or layer is referred to as being "directly on," "directly connected to," "directly coupled to," "directly connected with," "directly coupled with," or "immediately adjacent to" another element or layer, there are no intervening elements or layers present.

Further, throughout the specification, the word "on the plane" means the case in which a target is viewed from the top, and the word "on the cross section" means the case in which a cross section of a target taken along a vertical direction is viewed from the side.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments only and is not intended to be limiting of the present invention. As used herein, the singular forms "a" and "an" are intended to include the plural forms as well, unless the context clearly indicates otherwise.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

An organic light emitting diode display according to an exemplary embodiment of the present disclosure will be described in detail with reference to the accompanying drawings.

FIG. 1 is an equivalent circuit diagram of one pixel of an organic light emitting diode display according to an exemplary embodiment of the present disclosure.

As shown in FIG. 1, the organic light emitting diode display according to an exemplary embodiment of the present disclosure includes a plurality of signal lines 121, 171, and 172 formed on a substrate, and a plurality of pixels P connected to the plurality of signal lines 121, 171, and 172 and arranged approximately in a matrix.

The signal lines include a plurality of first signal lines 121 for transferring gate signals (or scanning signals), a plurality of second signal lines 171 for transferring data signals, and a plurality of third signal lines 172 for transferring a driving voltage Vdd. The first signal lines 121 are extended substantially in a row direction and are substantially in parallel with each other, and the second signal lines 171 and the third signal lines 172 are extended substantially in a column direction while crossing the first signal lines 121 and are substantially in parallel with each other.

Each pixel P includes a driving thin film transistor Qd, a switching thin film transistor Qs, a storage capacitor Cst, and an organic light emitting diode (OLED) LD.

The driving thin film transistor Qd has a control terminal, an input terminal, and an output terminal, wherein the control terminal is connected to the switching thin film transistor Qs, the input terminal is connected to the third signal line 172, and the output terminal is connected to the organic light emitting diode LD. The driving thin film transistor Qd allows an output current $I_{LD}$, of which a magnitude is changed depending on a voltage applied between the control terminal and the input terminal, to flow.

The switching thin film transistor Qs also has a control terminal, an input terminal, and an output terminal, wherein the control terminal is connected to the first signal line 121, the input terminal is connected to the second signal line 171, and the output terminal is connected to the driving thin film transistor Qd. The switching thin film transistor Qs transfers the data signal applied to the second signal line 171 to the driving thin film transistor Qd in response to the scanning signal applied to the first signal line 121.

The storage capacitor Cst is connected between the control terminal and the input terminal of the driving thin film transistor Qd. The storage capacitor Cst is charged with the data signal applied to the control terminal of the driving thin film transistor Qd, and maintains the data signal even after the switching thin film transistor Qs is turned off.

The organic light emitting diode LD has an anode connected to the output terminal of the driving thin film transistor Qd and a cathode connected to the common voltage Vss. The organic light emitting diode LD emits light at an intensity changed depending on the output current $I_{LD}$ of the driving thin film transistor Qd to display an image.

Figure 2:
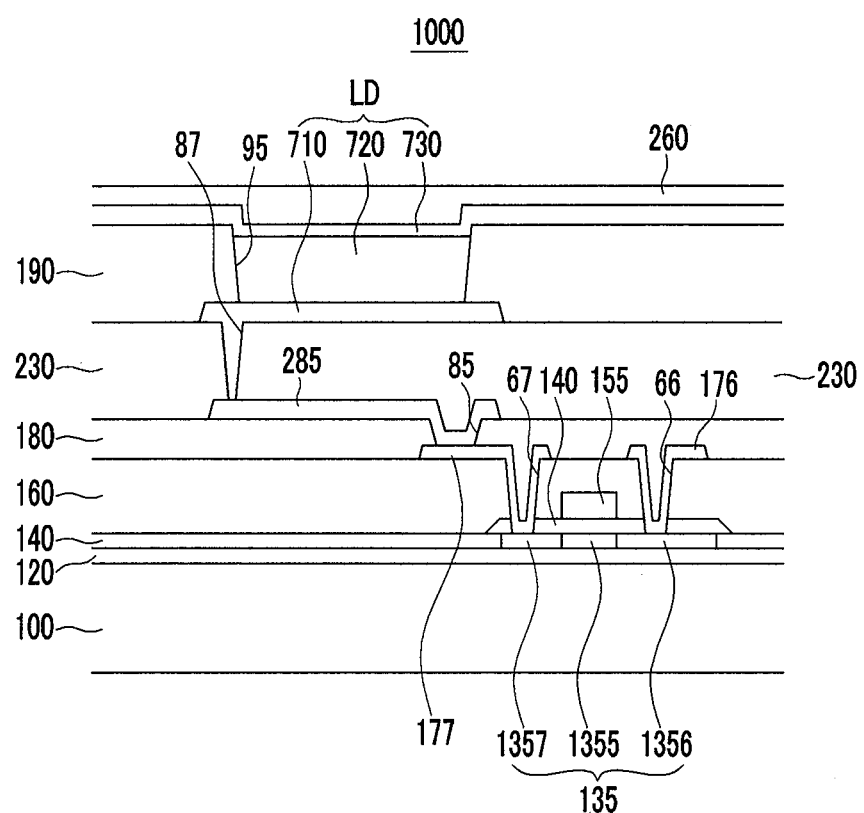
FIG. 2 is a schematic cross-sectional view of the organic light emitting diode display according to an exemplary embodiment of the present disclosure.

FIG. 2 is a schematic cross-sectional view of the organic light emitting diode display according to an exemplary embodiment of the present disclosure.

Since the switching thin film transistor and the driving thin film transistor included in one pixel have the same or substantially the same laminar structure, the driving thin film transistor Qd and the organic light emitting diode LD will be mainly described in detail as a stacked sequence. Hereinafter, the driving thin film transistor Qd of FIG. 1 will be referred to as a thin film transistor Q.

As shown in FIG. 2, the organic light emitting diode display 1000 may include a substrate 100 and a buffer layer 120 formed on the substrate 100.

The buffer layer 120 may be formed of a single layer of a silicon nitride (SiNx) or a dual-layer structure in which a silicon nitride (SiNx) and a silicon oxide (SiO$_x$) are stacked. The buffer layer 120 serves toplanarize a surface while preventing or reducing permeation of an unnecessary component of impurities or moisture.

A semiconductor 135 is formed on the buffer layer 120. The semiconductor 135 may be formed of a polysilicon or oxide semiconductor. The oxide semiconductor may include an oxide of titanium (Ti), hafnium (Hf), zirconium (Zr), aluminum (Al), tantalum (Ta), germanium (Ge), zinc (Zn), gallium (Ga), tin (Sn), indium (In), or combinations thereof. For example, the oxide semiconductor may include one or more of an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), a hafnium-indium-zinc oxide (Hf—In—Zn—O), and combinations thereof, which are composite oxides.

When the semiconductor 135 is formed of the oxide semiconductor, a separate protecting layer may be added in order to protect the oxide semiconductor vulnerable to an external environment such as a high temperature, and/or the like.

The semiconductor 135 includes a channel 1355, which is channel-doped with N-type impurities or P-type impurities, and a source region 1356 and a drain region 1357 formed at respective sides of the channel and having a doping concentration higher than that of the impurities doped in the channel.

A gate insulating layer 140 is formed on the semiconductor 135. The gate insulating layer 140 may be formed of a single layer or a multilayer including at least one of a tetra ethyl ortho silicate (TEOS), a silicon nitride, and a silicon oxide.

A gate electrode 155 is formed on the semiconductor 135, and is overlapped with the channel region 1355.

The gate electrode 155 may be formed of a single layer or a multilayer made of a low resistance material such as Al, Ti, Mo, Cu, Ni, and/or an alloy thereof or a material resistant to corrosion.

A first interlayer insulating layer 160 is formed on the gate electrode 155. The first interlayer insulating layer 160 may be formed of a single layer or a multilayer made of a tetra ethyl ortho silicate (TEOS), a silicon nitride, a silicon oxide, and/or the like, similar to the gate insulating layer 140.

The first interlayer insulating layer 160 and the gate insulating layer 140 have a source contact hole 66 and a drain contact hole 67 respectively exposing the source region 1356 and the drain region 1357.

A source electrode 176 and a drain electrode 177 are formed on the first interlayer insulating layer 160. The source electrode 176 is connected to the source region 1356 through the source contact hole 66, and the drain electrode 177 is connected to the drain region 1357 through the drain contact hole 67.

The source electrode 176 and the drain electrode 177 may be formed of a single layer or a multilayer made of a low resistance material such as Al, Ti, Mo, Cu, Ni, and/or an alloy thereof or a material resistant to corrosion. For example, the source electrode 176 and the drain electrode 177 may be a triple layer of Ti/Cu/Ti, Ti/Ag/Ti, or Mo/Al/Mo.

Figure 3:
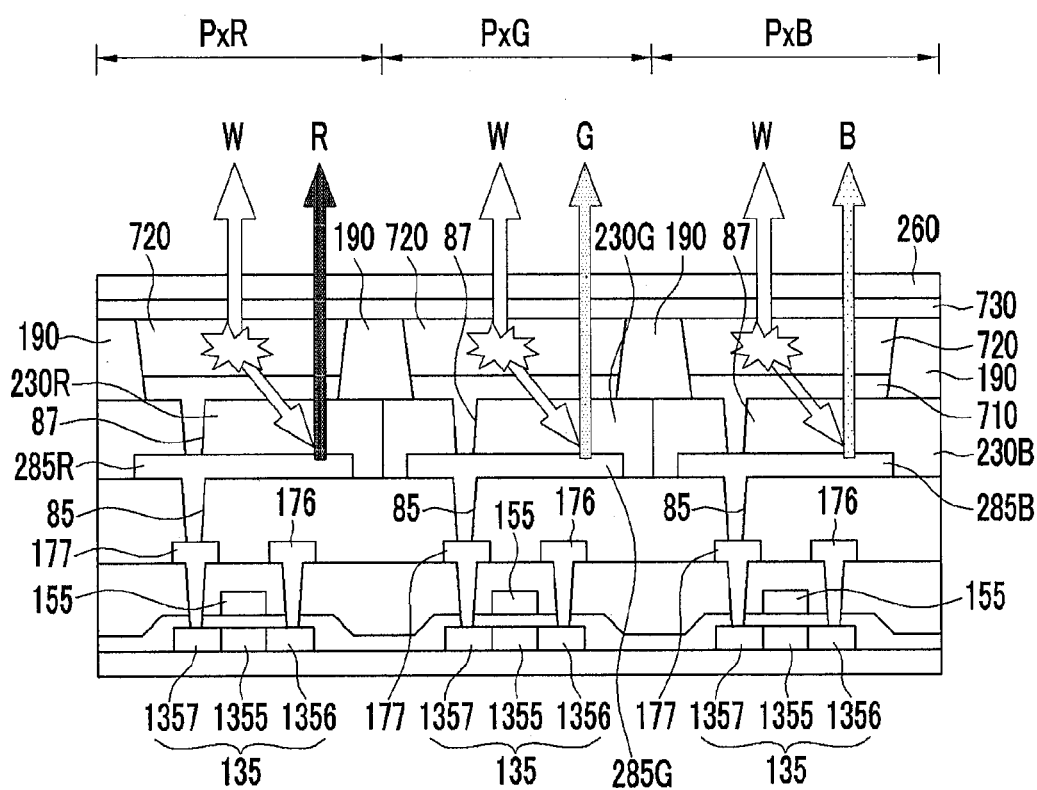
FIG. 3 is a schematic cross-sectional view of a plurality of pixels for illustrating an optical path of the organic light emitting diode display according to an exemplary embodiment of the present disclosure.

The thin film transistor includes the gate electrode 155, the source electrode 176, the drain electrode 177, which are a control electrode, an input electrode, and an output electrode of FIG. 3, respectively, and the semiconductor 135. A channel of the thin film transistor is formed in the semiconductor 135 between the source electrode 176 and the drain electrode 177.

A second interlayer insulating layer 180 is formed on the source electrode 176 and the drain electrode 177. The second interlayer insulating layer 180 includes a contact hole 85 exposing the drain electrode 177.

The second interlayer insulating layer 180 may be formed of a single layer or a multilayer made of a tetra ethyl ortho silicate (TEOS), a silicon nitride, a silicon oxide, and/or the like, similar to the first interlayer insulating layer, and may be made of a low-k organic material.

A reflecting electrode 285 is formed on the second interlayer insulating layer 180. The reflecting electrode 285 is electrically connected to the drain electrode through the contact hole 85.

A color filter 230 is formed on the second interlayer insulating layer 180. The color filter 230 includes a contact hole 87 exposing the reflecting electrode 285. The color filter 230 may be red, green, or blue.

The reflecting electrode 285 may be made of a material having a high reflectivity and an excellent conductivity, for example, aluminum (Al) or silver (Ag).

A first electrode 710 is formed on the color filter 230. The first electrode 710 is electrically connected to the reflecting electrode 285 through the contact hole 87 formed in the color filter 230, and may be an anode electrode of the organic light emitting diode of FIG. 1.

A pixel definition layer 190 is formed on the first electrode 710.

The pixel definition layer 190 has an opening 95 exposing the first electrode 710. The pixel definition layer 190 may be formed of a resin, such as polyacrylates, polyimides, and/or the like, a silica based inorganic material, and/or the like.

An organic emission layer 720 is formed in the opening 95 of the pixel definition layer 190.

The organic emission layer 720 is formed of a multilayer including one or more of an emission layer, a hole-injection layer (HIL), a hole-transporting layer (HTL), an electron-transporting layer (ETL), and an electron-injection layer (EIL).

When the organic emission layer 720 includes all of these layers, the hole-injection layer may be positioned on the first electrode 710, which is the anode electrode, and the hole-transporting layer, the emission layer, the electron-transporting layer, and the electron-injection layer may be sequentially stacked on the hole-injection layer.

The emission layer, which is a white emission layer for emitting white light, may be formed of one emission layer for emitting white light. Alternatively, emission layers for emitting light having a plurality of different colors may be stacked to emit white light. For example, the emission layer may include a configuration enabling white light emission by a combination of at least one yellow emission layer and at least one blue emission layer, a configuration enabling white light emission by a combination of at least one cyan emission layer and at least one red emission layer, a configuration enabling white light emission by a combination of at least one magenta emission layer and at least one green emission layer, and/or the like.

A second electrode 730, which is a cathode electrode of FIG. 1, is formed on the pixel definition layer 190 and the organic emission layer 720.

The organic light emitting diode LD includes the first electrode 710, the organic emission layer 720, and the second electrode 730.

The organic light emitting diode display is a front surface display type display (i.e., a top emission display) according to a direction in which the organic light emitting diode LD emits light. When the organic light emitting diode display is the front surface display type display, the first electrode 710 and the second electrode 730 are formed of a transflective layer or a transmitting layer. The transflective layer may be made of one or more metal selected from the group consisting of magnesium (Mg), silver (Ag), gold (Au), calcium (Ca), lithium (Li), chromium (Cr), and aluminum (Al), and/or an alloy thereof. Here, the transflective layer may be formed at a thickness of 200 nm or less. The thinner the thickness of the transflective layer, the higher the transmittance. However, when the thickness of the transflective layer is excessively thin, a resistance is increased.

The transmitting layer may be formed of an indium tin oxide (ITO), an indium zinc oxide (IZO), a zinc oxide (ZnO), an indium oxide ($In_2O_3$), or combinations thereof.

An encapsulation member 260 is formed on the second electrode 730. The encapsulation member may be a plurality of thin films or an encapsulation substrate made of glass, and/or the like.

An encapsulation layer may include one or more organic layers and one or more inorganic layers that are alternately formed. The numbers of inorganic layers and organic layers may be plural, respectively.

The organic layer may be formed of polymer, and may be a single layer or a stacked layer formed of polyethylene terephthalate, polyimide, polycarbonate, epoxy, polyethylene, polyacrylate, or combinations thereof. The organic layer may be formed of polyacrylate. In some embodiments, the organic layer may include a polymerized monomer composition including a diacrylate based monomer and a triacrylate based monomer. A mono-acrylate based monomer may be further included in the monomer composition. In addition, a known photo-initiator such as TPO may be further included in the monomer composition, but is not limited thereto.

The inorganic layer may be a single layer or a stacked layer including a metal oxide or a metal nitride. In some embodiments, the inorganic layer may include SiNx, $Al_2O_3$, $SiO_2$, $TiO_2$, or combinations thereof.

The uppermost layer exposed to the outside in the encapsulation layer may be an inorganic layer in order to prevent or reduce permeation of moisture into the organic light emitting diode.

The encapsulation layer may include at least one sandwich structure in which at least one organic layer is inserted between at least two inorganic layers. In addition, the encapsulation layer may include one sandwich structure in which at least one inorganic layer is inserted between at least two organic layers.

When the organic light emitting diode display is manufactured to include the reflecting electrode as in the present disclosure, a luminance of the organic light emitting diode display may be improved. This will be described in detail with reference to FIG. 3.

FIG. 3 is a schematic cross-sectional view of a plurality of pixels for illustrating an optical path of the organic light emitting diode display according to an exemplary embodiment of the present disclosure.

Here, a red pixel P×R, a green pixel P×G, and a blue pixel P×B are formed on the substrate 100.

Each of the red pixel P×R, the green pixel P×G, and the blue pixel P×B includes the semiconductor 135 having the channel region 1355, the drain region 1357, and the source region 1356, and the source electrode 176 and drain electrode 177 connected to the semiconductor through the contact holes 66 and 67, respectively.

In addition, the drain electrodes 177 of the pixels are connected to reflecting electrodes 285R, 285G, and 285B through the contact holes 85, respectively, and a red color filter 230R, a green color filter 230G, and a blue color filter 230B are formed on the reflecting electrodes 285R, 285G, and 285B, respectively.

The first electrodes 710 connected to the reflecting electrodes 285R, 285G, and 285B through the contact holes 87, respectively, are formed on the color filters of respective pixels, the pixel definition layer 190, having the openings 95 exposing the first electrodes 710, is formed on the color filters, and the organic white emission layer 720 is formed in the openings 95. The second electrodes 730 are formed on the organic emission layer 720, and the encapsulation members 260 are formed on the second electrodes 730.

When driving the red pixel P×R among the red pixel P×R, the green pixel P×G, and the blue pixel P×B, the organic emission layer of the organic light emitting diode LD emits white light, and some of the emitted light is emitted through a front surface of the organic light emitting diode display. In addition, other of the emitted light is transferred to the reflecting electrode 285R through the first electrode 710 and the red color filter 230R and is reflected on the reflecting electrode 285R. The light transferred to the reflecting electrode 285R is reflected on the reflecting electrode 285R and passes through the red color filter 230R to thereby be converted into red light and be emitted to the front surface of the organic light emitting diode display.

As in the present disclosure, the red light passing through the red color filter is synthesized with the white light emitted from the organic emission layer, such that a luminance of the red light is increased. When the luminance of the red light is increased as described above, visibility of each pixel may be improved even in an environment where there is an external light (e.g., sunlight or other bright lights).

Although only the red pixel has been described hereinabove, luminances of the green pixel and the blue pixel are similarly increased.

Figure 4:
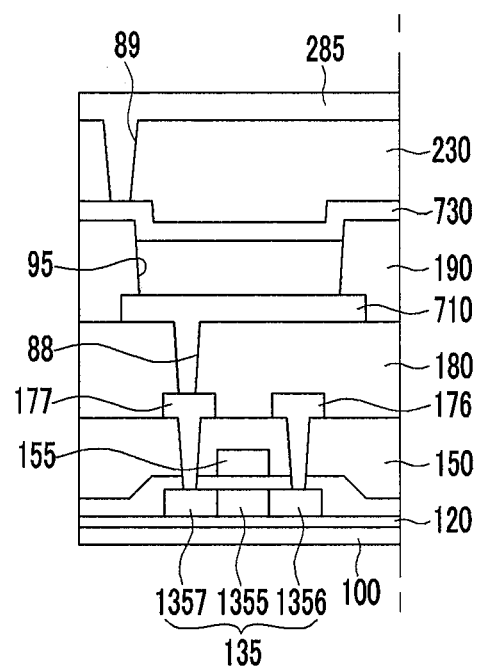
FIG. 4 is a schematic cross-sectional view of an organic light emitting diode display according to another exemplary embodiment of the present disclosure.

FIG. 4 is a schematic cross-sectional view of an organic light emitting diode display according to another exemplary embodiment of the present disclosure.

Since most of the organic light emitting diode display of FIG. 4 is the same or substantially the same as that of the organic light emitting diode display of FIG. 2, only configurations different from those of FIG. 2 will be described in detail.

As shown in FIG. 4, the organic light emitting diode display according to another exemplary embodiment of the present disclosure includes a buffer layer 120 formed on a substrate 100, a semiconductor 135 formed on the buffer layer 120 and having a source region 1356, a drain region 1357, and a channel region 1355, a gate electrode 155 formed on the semiconductor 135, a first interlayer insulating layer 160 formed on the gate electrode 155, and a source electrode 176 and a drain electrode 177 formed on the first interlayer insulating layer 160 and connected to the source region 1356 and the drain region 1357 through contact holes 66 and 67, and a second interlayer insulating layer 180 formed on the source electrode 176 and the drain electrode 177.

In addition, a first electrode 710 is formed on the second interlayer insulating layer 180. The first electrode 710 may be a transflective layer or a transmitting layer for transmitting light therethrough. For example, the transflective layer may be made of one or more metal selected from the group consisting of magnesium (Mg), silver (Ag), gold (Au), calcium (Ca), lithium (Li), chromium (Cr), and aluminum (Al), and/or an alloy thereof. Here, the transflective layer may be formed at a thickness of 200 nm or less. The thinner the thickness of the transflective layer, the higher the transmittance. However, when the thickness of the transflective layer is excessively thin, a resistance is increased.

The transmitting layer may be formed of an indium tin oxide (ITO), an indium zinc oxide (IZO), a zinc oxide (ZnO), an indium oxide ($In_2O_3$), or combination thereof.

In addition, a pixel definition layer 190 having an opening 95 exposing the first electrode 710 is formed on the second interlayer insulating layer 180.

An organic emission layer 720 is formed in the opening 95 of the pixel definition layer 190. A second electrode 730 is formed on the organic emission layer 720. The second electrode 730 may be a transflective layer or a transmitting layer and be made of a material that is the same or substantially the same as that of the first electrode 710.

A color filter 230 is formed on the second electrode 730. The color filter 230 may be a red color filter, a green color filter, or a blue color filter.

A reflecting electrode 285 connected to the second electrode 730 through a contact hole 89 formed in the color filter 230 is formed on the color filter 230. The reflecting electrode 285 may be made of a material having a low resistance and a high reflectivity, for example, aluminum (Al) or silver (Ag).

In FIG. 4, the second electrode 730 is formed, and the color filter 230 is formed on the second electrode 730, unlike FIG. 2.

In the organic light emitting diode display shown in FIG. 4, some of the white light emitted from the organic emission layer 720 passes through the substrate 100 and is emitted. In addition, other of the white light passes through the second electrode 730 and the color filter 230, is reflected on the reflecting electrode 285, again passes through the color filter 230 and the second electrode 730, passes through the substrate 100, and is emitted.

When the organic light emitting diode display is formed as shown in FIG. 4, colored light of each pixel, reflected through the reflecting electrode and the white light emitted from the organic emission layer are synthesized with each other, such that a luminance of each pixel is increased.

In addition, in FIG. 4, the second electrode and the reflecting electrode are connected to each other through the contact hole, thereby making it possible to decrease a resistance due to a large area of the second electrode formed over the entire substrate. Therefore, a voltage drop of the second electrode for driving the organic emission layer may be reduced or minimized.

Figure 5:
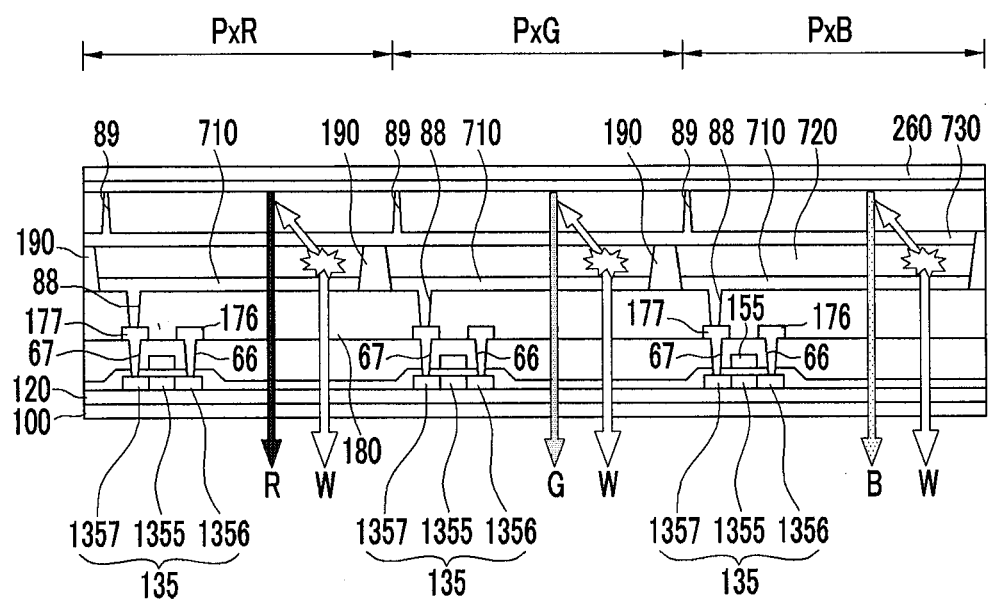
FIG. 5 is a schematic cross-sectional view of a plurality of pixels for illustrating an optical path of the organic light emitting diode display according to another exemplary embodiment of the present disclosure.

FIG. 5 is a schematic cross-sectional view of a plurality of pixels for illustrating an optical path of the organic light emitting diode display according to another exemplary embodiment of the present disclosure.

Here, a red pixel P×R, a green pixel P×G, and a blue pixel P×B are formed on the substrate 100.

Each of the red pixel P×R, the green pixel P×G, and the blue pixel P×B include the semiconductor 135 having the channel region 1355, the drain region 1357, and the source region 1356, and the source electrode 176 and drain electrode 177 connected to the semiconductor through the contact holes 66 and 67.

The drain electrodes 177 of each pixel are connected to the first electrodes 710 through the contact holes 88, respectively, the pixel definition layer 190 having the openings 95 exposing the first electrodes 710 is formed on the second interlayer insulating layer 180, the white organic emission layer 720 is formed in the openings 95, and the second electrodes 730 are formed on the organic emission layer 720.

In addition, a red color filter 230R, a green color filter 230G, and a blue color filter 230B are formed on respective second electrodes 730.

The reflecting electrodes 285 connected to the second electrodes 730 through the contact holes 89 are formed on the color filters of each pixel, and the encapsulation members 260 are formed on the reflecting electrodes 285.

When driving the red pixel P×R among the red pixel P×R, the green pixel P×G, and the blue pixel P×B, the organic emission layer of the organic light emitting diode LD emits white light, and some of the emitted light is emitted through a front surface of the organic light emitting diode display. In addition, other of the emitting light is transferred to the reflecting electrode 285 through the second electrode 710 and the red color filter 230R and is reflected by the reflecting electrode 285. The light transferred to the reflecting electrode 285 is reflected on the reflecting electrode 285 and passes through the red color filter 230R and the first electrode 710 to thereby be converted into red light and be emitted to the rear surface of the organic light emitting diode display.

As described above, the red light passing through the red color filter 230R is synthesized with the white light emitted from the organic emission layer, such that a luminance of the red light is increased. When the luminance of the red light is increased, visibility of each pixel may be improved even in an environment such as external light.

Although only the red pixel has been described hereinabove, luminances of the green pixel and the blue pixel are similarly increased.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims, and their equivalents.

DESCRIPTION OF SOME OF THE REFERENCE CHARACTERS

66, 67, 85, 87, 89: contact hole

| | |
|---|---|
| 95: opening | 100: substrate |
| 120: buffer layer | 121: first signal line |
| 135: semiconductor | 140: gate insulating layer |
| 155: gate electrode | 160: first interlayer insulating layer |
| 171: second signal line | 172: third signal line |
| 176: source electrode | 177: drain electrode |
| 180: second interlayer insulating layer | 190: pixel definition layer |
| 230: color filter | 260: encapsulation member |
| 285: reflecting electrode | 710: first electrode |
| 720: emission layer | 730: second electrode |
| 1000: light emitting diode display | 1355: channel region |
| 1356: source region | |
| 1357: drain region | |

What is claimed is:

1. An organic light emitting diode display comprising;
   a substrate;
   a transistor on the substrate;
   a reflecting electrode connected to the drain electrode of the transistor;
   a color filter on the reflecting electrode;
   a first electrode on the color filter and electrically connected to the reflecting electrode;
   a pixel definition layer on the color filter and having an opening exposing the first electrode;
   a white emission layer in the opening; and
   a second electrode on the white emission layer.

2. The organic light emitting diode display of claim 1, wherein the first electrode and the second electrode comprise a transparent conductive material.

3. The organic light emitting diode display of claim 2, wherein the transparent conductive material is indium tin oxide (ITO) or indium zinc oxide (IZO).

4. The organic light emitting diode display of claim 1, wherein the reflecting electrode comprises a reflecting material.

5. The organic light emitting diode display of claim 4, wherein the reflecting material is silver.

6. The organic light emitting diode display of claim 1, wherein the color filter is a red color filter, a green color filter, or a blue color filter.

* * * * *